(12) United States Patent
Sugiura et al.

(10) Patent No.: US 12,080,733 B2
(45) Date of Patent: Sep. 3, 2024

(54) PHOTODETECTOR

(71) Applicant: Panasonic Intellectual Property Management Co., Ltd., Osaka (JP)

(72) Inventors: Yuki Sugiura, Kyoto (JP); Akito Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 999 days.

(21) Appl. No.: 17/026,864

(22) Filed: Sep. 21, 2020

(65) Prior Publication Data
US 2021/0005646 A1 Jan. 7, 2021

Related U.S. Application Data

(63) Continuation of application No. PCT/JP2019/009959, filed on Mar. 12, 2019.

(30) Foreign Application Priority Data

Mar. 27, 2018 (JP) .................................. 2018-060929

(51) Int. Cl.
*H01L 27/146* (2006.01)
*H01L 31/107* (2006.01)

(52) U.S. Cl.
CPC .... *H01L 27/1461* (2013.01); *H01L 27/14603* (2013.01); *H01L 27/14643* (2013.01); *H01L 31/107* (2013.01)

(58) Field of Classification Search
CPC ........... H01L 27/1461; H01L 27/14603; H01L 27/14643; H01L 31/107; H01L 27/1463; H01L 31/035272
See application file for complete search history.

(56) References Cited

U.S. PATENT DOCUMENTS 5,596,186 A * 1/1997 Kobayashi ............ H01L 31/107
257/E31.063
6,359,322 B1 3/2002 Haralson et al.
(Continued)

FOREIGN PATENT DOCUMENTS

JP 55-91184 A 7/1980
JP 7-221341 A 8/1995
(Continued)

OTHER PUBLICATIONS

International Search Report dated May 12, 2019, issued in counterpart International Application No. PCT/JP2019/009959 (2 pages).

*Primary Examiner* — Evan G Clinton
(74) *Attorney, Agent, or Firm* — WHDA, LLP

(57) ABSTRACT

A solid-state imaging device includes: a p-type semiconductor substrate; an n-type first semiconductor layer located above the semiconductor substrate and forming a junction with the semiconductor substrate in the first area; and an n-type second semiconductor layer located between the semiconductor substrate and the first semiconductor layer in the second area outward of the first area and having an impurity concentration lower than an impurity concentration of the first semiconductor layer. The semiconductor substrate and the first semiconductor layer form APD1, and the second semiconductor layer extends to a level below an interface between the semiconductor substrate and the first semiconductor layer in a thickness direction of the semiconductor substrate.

14 Claims, 8 Drawing Sheets

(56) References Cited

U.S. PATENT DOCUMENTS

| | | | |
|---|---|---|---|
| 9,178,100 B2 | 11/2015 | Webster et al. | |
| 2006/0125035 A1* | 6/2006 | Yaung | H01L 27/14643 438/57 |
| 2014/0339398 A1* | 11/2014 | Mazzillo | H01L 31/02327 250/208.2 |
| 2018/0195900 A1 | 7/2018 | Delic | |
| 2018/0197905 A1 | 7/2018 | Sakata et al. | |

FOREIGN PATENT DOCUMENTS

| | | |
|---|---|---|
| JP | 11-26803 A | 1/1999 |
| WO | 2017/004663 A1 | 1/2017 |
| WO | 2017/043068 A1 | 3/2017 |

\* cited by examiner

PHOTODETECTOR

CROSS REFERENCE TO RELATED APPLICATIONS

This application is a U.S. continuation application of PCT International Patent Application Number PCT/JP2019/009959 filed on Mar. 12, 2019, claiming the benefit of priority of Japanese Patent Application Number 2018-060929 filed on Mar. 27, 2018, the entire contents of which are hereby incorporated by reference.

BACKGROUND

1. Technical Field

The present disclosure relates to a photodetector, particularly a photodetector capable of detecting weak light.

2. Description of the Related Art

In recent years, highly sensitive photodetectors are used in various fields such as a medical field, a communication field, a biotechnology field, a chemical field, a monitoring system, an in-vehicle technology, or radiation sensing. An avalanche photodiode (APD) is known as one of the highly sensitive photodetectors. The APD is a photodiode that enhances the sensitivity of light detection by multiplying photo-generated signal charges using avalanche breakdown.

SUMMARY

The present disclosure provides a photodetector capable of reducing an electric field strength in the edge portion.

A photodetector according to an aspect of the present disclosure includes: a semiconductor substrate of a first conductivity type; a first semiconductor layer of a second conductivity type that is located above the semiconductor substrate and forms a junction with the semiconductor substrate in a first area, the second conductivity type being different from the first conductivity type; and a second semiconductor layer of the second conductivity type that is located above the semiconductor substrate in a second area outward of the first area, the second semiconductor layer having an impurity concentration lower than an impurity concentration of the first semiconductor layer, in which the semiconductor substrate and the first semiconductor layer form a photoelectric converter including a charge multiplication region in which charges are multiplied by avalanche multiplication, and the second semiconductor layer extends to a level below an interface between the semiconductor substrate and the first semiconductor layer in a thickness direction of the semiconductor substrate.

According to the present disclosure, a photodetector capable of reducing an electric field strength in the edge portion is achieved.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

Figure 1:
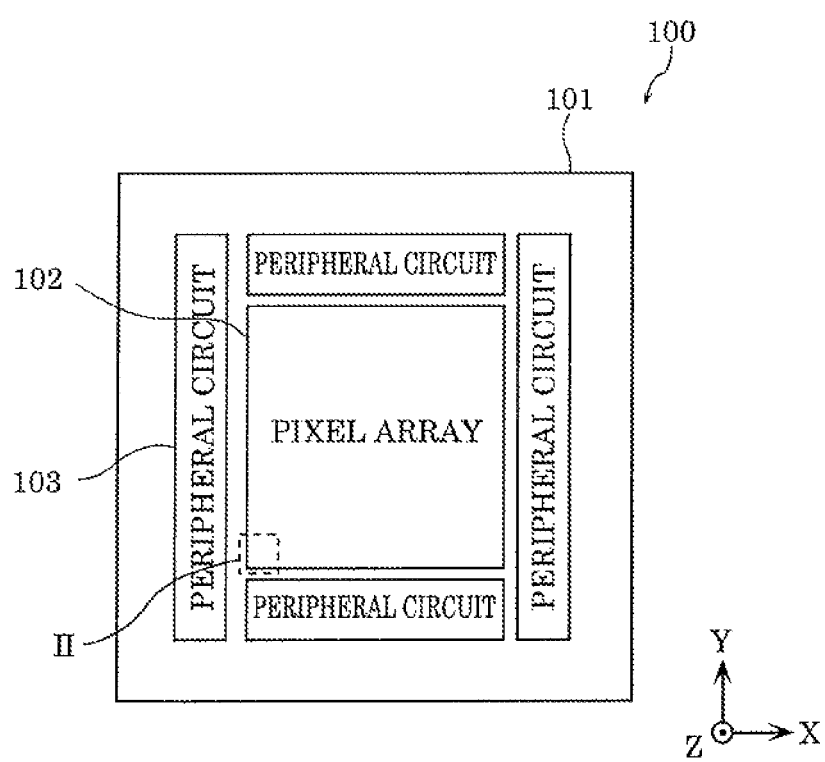
FIG. 1 is a plan view of the entirety of a solid-state imaging device according to embodiment 1.

DETAILED DESCRIPTION OF THE EMBODIMENTS (Underlying Knowledge Forming Basis of Present Disclosure)

An avalanche photodiode (APD) using avalanche multiplication and including a pn junction where a high electric field is generated is known as an element for making a solid-state imaging device such as a complementary metal-oxide-semiconductor (CMOS) imaging sensor more sensitive (see U.S. Pat. No. 9,178,100, for example). Moreover, a solid-state imaging device including APDs arranged in an array and capable of generating a high-resolution image from weak light is proposed (see WO 2017/043068, for example).

The structure disclosed in WO 2017/043068 is disadvantageous in making the device more sensitive since the APDs are located under a pixel circuit. In order to make the APD pixel array more sensitive, the APDs are needed to be formed near the top surface of the solid-state imaging device. The edge portion of the APD pixel array is typically designed to have a low electric field. In some cases, however, a pn junction of a high impurity density may be unintendedly formed between the edge portion and elements included in a peripheral circuit, thereby having a high electric field. Moreover, a possible extension region for a depletion layer is decreased by forming the APDs near the top surface, and thus it may be difficult to have a lower electric field. In other words, the edge portion of the APD pixel array is needed to improve the breakdown voltage and reduce leakage current by reducing the electric field strength.

In the embodiments described below, solid-state imaging devices each capable of reducing an electric field strength in the outer peripheral edge portion of a pixel array will be described with reference to drawings. It should be noted that the following embodiments show comprehensive or specific illustrations. The numerical values, shapes, structural components, the arrangement and connection of the structural components, steps, the processing order of the steps, etc. shown in the following embodiments are mere examples, and thus are not intended to limit the present disclosure. Of the structural components described in the following embodiments, structural components not recited in any one of the independent claims that indicate the broadest concepts of the present disclosure will, be described as optional structural components.

The figures are schematic illustrations and not necessarily precise illustrations. In the figures, substantially identical components are assigned the same reference signs, and overlapping descriptions thereof may be omitted or simplified.

Moreover, in the drawings used to illustrate the embodiments below, coordinate axes may be indicated. The Z-axis direction is, for example, vertical. The positive side of the Z-axis is referred to as an upper side (above), and the negative side of the Z-axis is referred, to as a lower side (below). In other words, the Z-axis direction is perpendicular to the top surface or the bottom surface of a semiconductor substrate, and is the thickness direction of the semiconductor substrate. Moreover, the X-axis direction and the Y-axis direction are orthogonal to each other in a plane (a horizontal plane) perpendicular to the Z-axis direction. The X-axis direction is referred to as a lateral direction, and the Y-axis direction is referred to as a longitudinal direction. In the embodiments below, "in a plan view" refers to a view from the Z-axis direction. Moreover, in the embodiments below, the present disclosure does not eliminate a structure in which p-type and n-type are reversed.

Embodiment 1

[Structure]

The following describes the structure of a solid-state imaging device according to embodiment 1. FIG. 1 is a plan view of the entirety of the solid-state imaging device according to embodiment 1.

As shown in FIG. 1, solid-state imaging device 100 includes substrate 101, pixel array 102 mounted on substrate 101, and peripheral circuits 103 implemented around pixel array 102 on substrate 101. In pixel array 102, multiple avalanche photodiodes (APDs) are arranged in an array. In other words, the APDs are arranged in a matrix.

Figure 2:
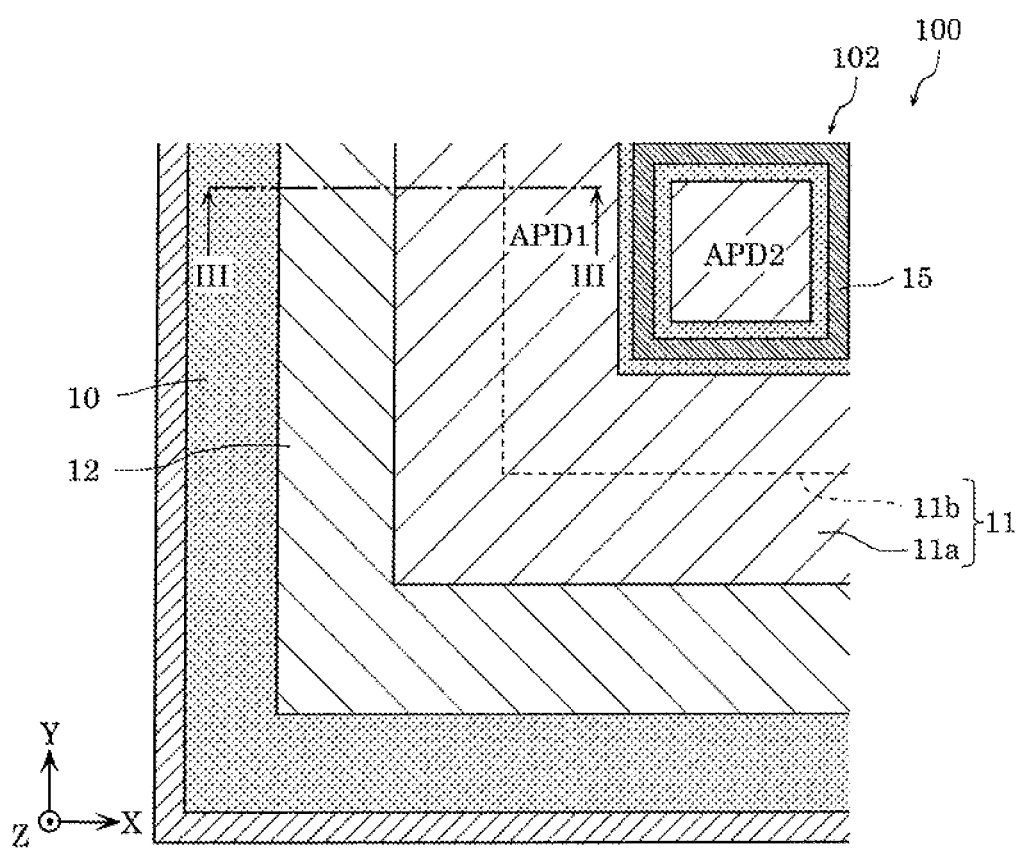
FIG. 2 is a plan view of an outer peripheral portion of a pixel array of the solid-state imaging device according to embodiment 1.
Figure 3:
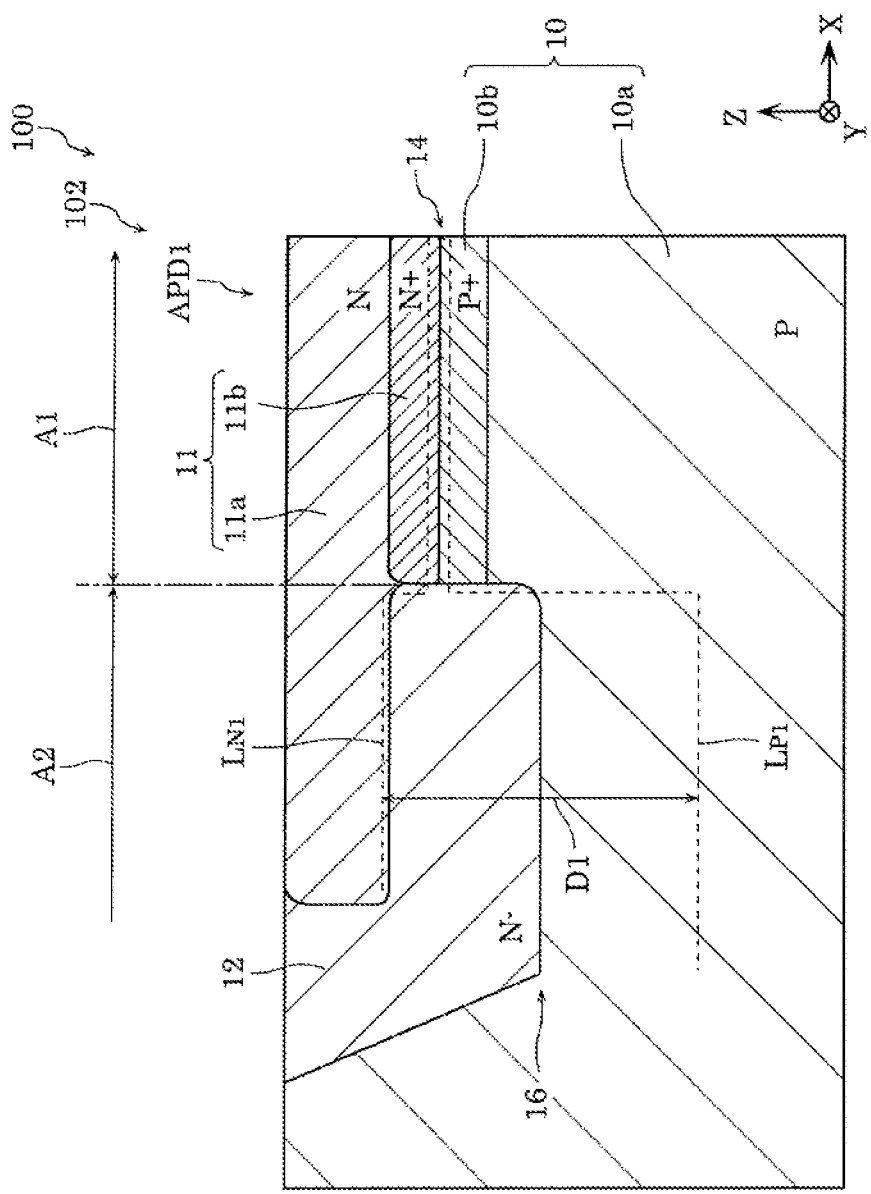
FIG. 3 is a sectional view of the outer peripheral portion of the pixel array of the solid-state imaging device according to embodiment 1.

FIG. 2 is a plan view of an outer peripheral portion (an area surrounded by the dotted line in FIG. 1) of pixel array 102. FIG. 3 is a sectional view of the outer peripheral portion of pixel array 102. FIG. 3 is the sectional view of pixel array 102 along the line III-III in FIG. 2.

As shown in FIG. 2 and FIG. 3, solid-state imaging device 100 includes semiconductor substrate 10, first semiconductor layer 11, and second semiconductor layer 12. It should be noted that in FIG. 3, the inside area (i.e., the positive side of the X-axis) of pixel array 102 (i.e., solid-state imaging device 100) is denoted as first area A1, and the outside area (i.e., the negative side of the X-axis) of pixel array 102 is denoted as second area A2. In FIG. 3, p-type depletion layer edge $L_{P1}$ and n-type depletion layer edge $L_{N1}$ are each denoted by the dotted line.

Semiconductor substrate 10 is made of a p-type semiconductor material. In particular, semiconductor substrate 10 includes: body 10a; and junction portion 10b located on body 10a and in contact with first semiconductor layer 11. The impurity concentration of body 10a ranges from $1\times10^{14}$ cm$^{-3}$ to $1\times10^{15}$ cm$^{-3}$, for example, and the impurity concentration of junction portion 10b ranges from $1\times10^{16}$ cm$^{-3}$ to $1\times10^{18}$ cm$^{-3}$, for example. Within such a range of impurity concentration, the impurity concentration of junction portion 10b is higher than that of body 10a.

Semiconductor substrate 11 is made of an n-type semiconductor material. First semiconductor layer 11 is located above semiconductor substrate 10. In particular, first semiconductor layer 11 includes body 11a and junction portion 11b located under body 11a and in contact with (i.e., forming a junction with) semiconductor substrate 10. Junction portion 11b is located in first area A1 of pixel array 102. In other words, first semiconductor layer 11 is in contact with semiconductor substrate 10 in first area A1.

The impurity concentration of body 11a ranges from $5\times10^{16}$ cm$^{-3}$ to $1\times10^{19}$ cm$^{-3}$, for example, and the impurity concentration of junction portion 11b ranges from $5\times10^{16}$ cm$^{-3}$ to $1\times10^{18}$ cm$^{-3}$, for example. Within such a range of impurity concentration, the impurity concentration of junction portion 11b is higher than that of body 11a.

Semiconductor substrate 10 and first semiconductor layer 11 form APD1 including a charge multiplication region in which charges are multiplied by avalanche multiplication. APD1 is one example of a photoelectric converter. In particular, APD1 is formed by a pn junction between p-type junction portion 10b and n-type junction portion 11b.

When a reverse bias voltage is applied to the bottom surface of semiconductor substrate 10, the charge multiplication region in which a signal charge can be multiplied into multiple signal charges is formed in the vicinity of interface 14 between semiconductor substrate 10 and first semiconductor layer 11. With this charge multiplication region, it is possible to detect weak light of 1 photon. The multiplied signal charges are accumulated in body 11a.

It should be noted that in the outer peripheral portion of pixel array 102, the shape or the like of the APD may be not good. Accordingly, for example, unlike APD2 located closer to the center of the pixel array than APD1 as shown in FIG. 2, APD1 formed in the outer peripheral portion of pixel array 102 is masked and unavailable. It should be noted that actual APD2 is surrounded by isolation region 15 in the plan view. Isolation region 15 is made of a p-type semiconductor material. The impurity concentration of isolation region 15 ranges from $1\times10^{16}$ cm$^{-3}$ to $1\times10^{17}$ cm$^{-3}$.

Second semiconductor layer 12 is made of an n-type semiconductor material. Second semiconductor layer 12 is located between semiconductor substrate 10 and first semiconductor layer 11, in second area A2 outward of first area A1. The impurity concentration of second semiconductor layer 12 ranges from $1\times10^{16}$ cm$^{-3}$ to $1\times10^{17}$ cm$^{-3}$. Moreover, second semiconductor layer 12 is in contact with first semiconductor layer 11 to cover the outer lateral surface of first semiconductor layer 11. As shown in FIG. 3, the outer lateral surface of second semiconductor layer 12 is inclined. Second semiconductor layer 12 is formed by injecting impurities, for example.

Figure 4:
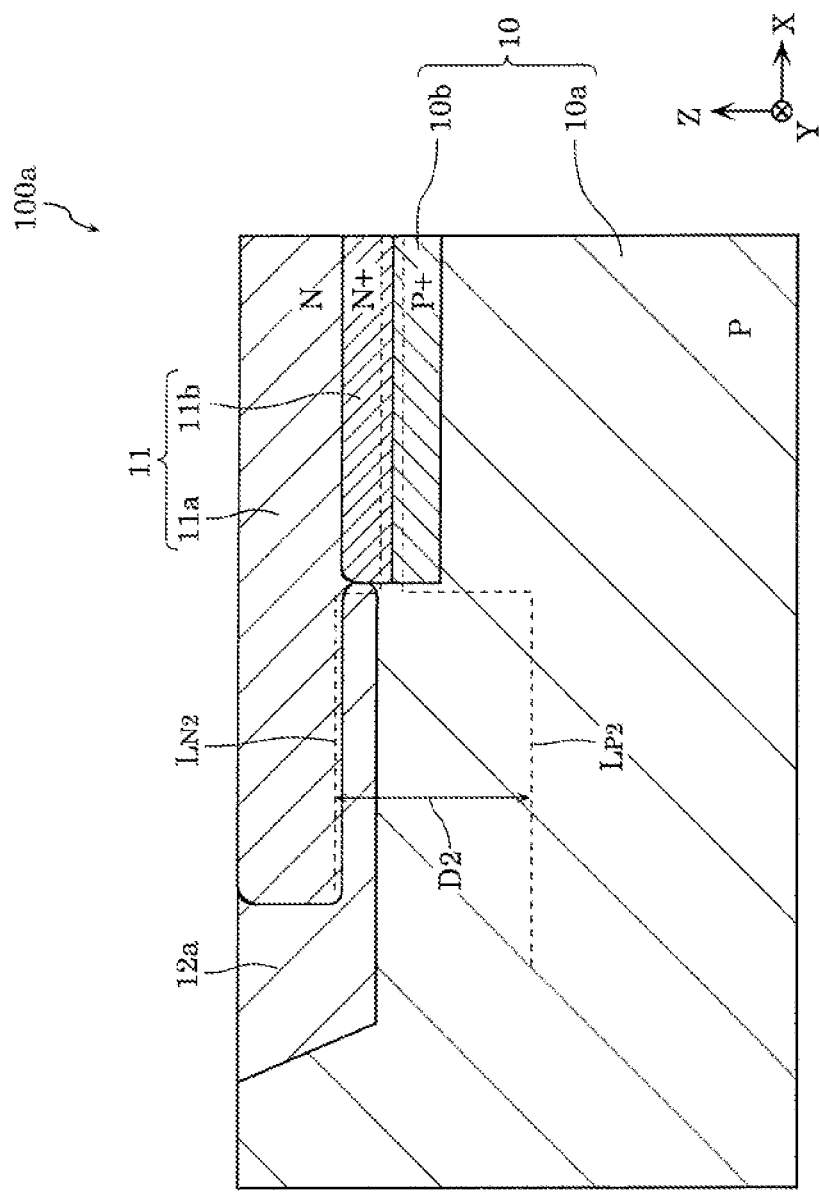
FIG. 4 is a sectional view of an outer peripheral portion of a pixel array of a solid-state imaging device according to a comparison example.

The following describes advantageous effects obtained by second semiconductor layer 12 with reference to a sectional view of a solid-state imaging device according to a comparison example. FIG. 4 is a sectional view of an outer peripheral portion of a pixel array of a solid-state imaging device according to the comparison example.

As shown in FIG. 4, second semiconductor layer 12a included in solid-state imaging device 100a according to the comparison example is thinner than second semiconductor layer 12 included in solid-state imaging device 100. Moreover, in FIG. 4, p-type depletion layer edge $L_{P2}$ and n-type depletion layer edge $L_{N2}$ are each denoted by the dotted line. In solid-state imaging device 100a, distance D2 from p-type depletion layer edge $L_{P2}$ to n-type depletion layer edge $L_{N2}$ is short, and thus a high electric field may be generated to decrease the breakdown voltage. In addition, leakage current may occur.

In contrast, in solid-state imaging device 100, second semiconductor layer 12 extends to a level below interface 14 between semiconductor substrate 10 and first semiconductor layer 11 in the thickness direction of semiconductor substrate 10. In this way, interface 16 between second semiconductor layer 12 and semiconductor substrate 10 is closer to the bottom surface of semiconductor substrate 10, and the depletion layer spreads over the top surface of semiconductor substrate 10. Thus, distance D1 from p-type depletion layer edge $L_{P1}$ to n-type depletion layer edge $L_{N1}$ becomes longer than D2. Accordingly, the electric field strength is reduced in the outer peripheral portion (i.e., the edge portion) of pixel array 102. Therefore, the breakdown voltage is improved and the leakage current is prevented.

[Advantageous Effects, Etc.]

As described above, solid-state imaging device 100 includes: semiconductor substrate 10 of a first conductivity type; first semiconductor layer 11 of a second conductivity type that is located above semiconductor substrate 10 and forms a junction with semiconductor substrate 10 in first area A1, the second conductivity type being different from the first conductivity type; and second semiconductor layer 12 of the second conductivity type that is located, between semiconductor substrate 10 and first semiconductor layer 11 in second area A2 outward of first area A1, second semiconductor layer 12 having an impurity concentration lower than an impurity concentration of first semiconductor layer 11. Solid-state imaging device 100 is one example of a photodetector. For example, the first conductivity type is p-type and the second conductivity type is n-type. Semiconductor substrate 10 and first semiconductor layer 11 form APD1 including a charge multiplication region in which charges are multiplied by avalanche multiplication, and second semiconductor layer 12 extends to a level below interface 14 between semiconductor substrate 10 and first semiconductor layer 11 in the thickness direction of semiconductor substrate 10. APD1 is one example of a photoelectric converter.

With this, interface 16 between second semiconductor layer 12 and semiconductor substrate 10 is closer to the bottom surface of semiconductor substrate 10, and the depletion layer spreads over the top surface of semiconductor substrate 10. Thus, distance D1 from p-type depletion layer edge $L_{P1}$ to n-type depletion layer edge $L_{N1}$ becomes relatively longer, and the electric field strength is reduced. Accordingly, the breakdown voltage is improved and the leakage current is prevented.

Moreover, semiconductor substrate 10 includes: body 10a; and junction portion 10b located on body 10a and in contact with first semiconductor layer 11. Body 10a is one example of a third portion, and junction portion 10b is one example of a fourth portion.

With this, it is possible to obtain the effect of easily forming the charge multiplication region.

Embodiment 2

[Structure]

Figure 5:
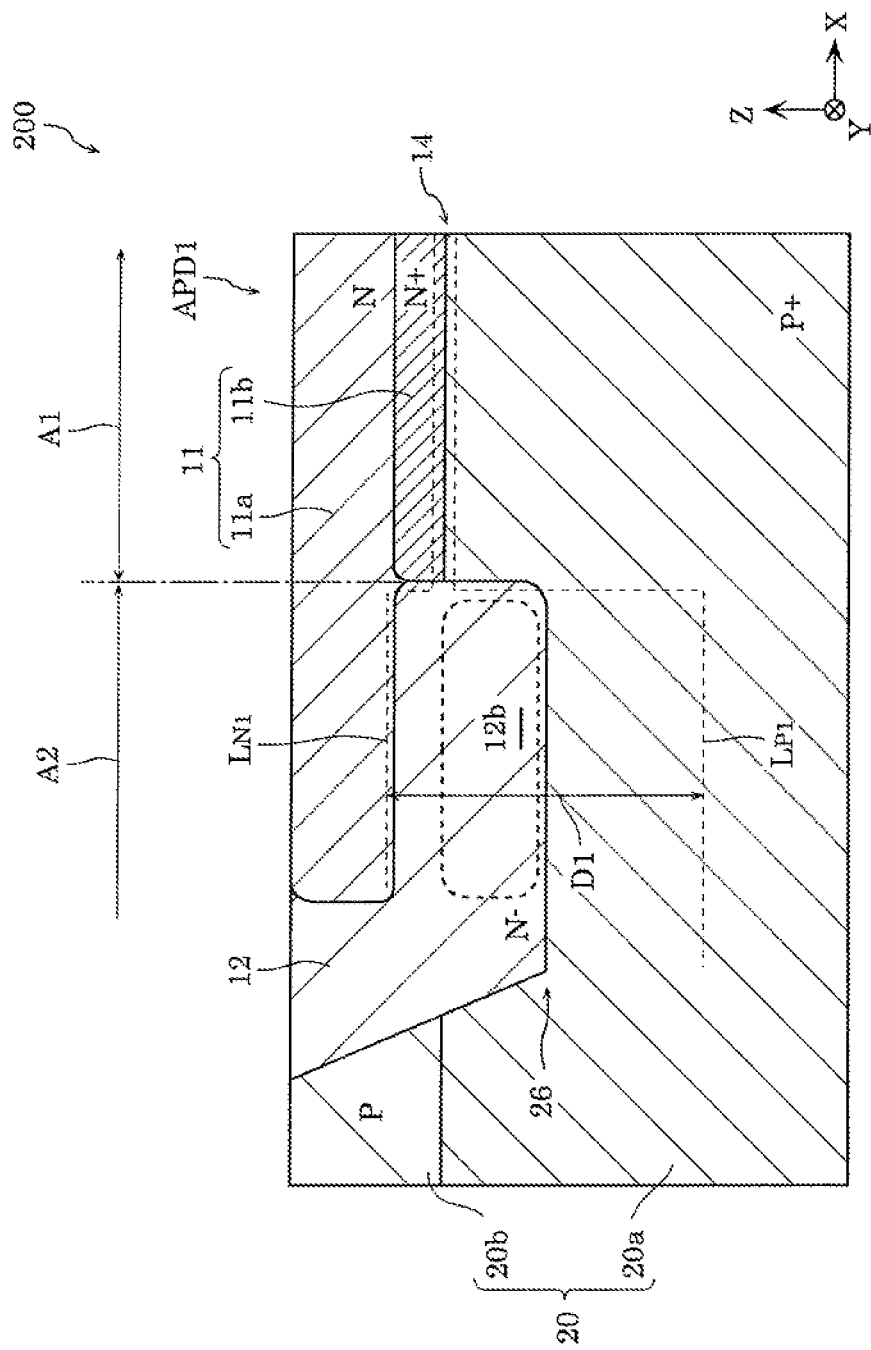
FIG. 5 is a sectional view of an outer peripheral portion of a pixel array of a solid-state imaging device according to embodiment 2.

The following describes the structure of a solid-state imaging device according to embodiment 2. FIG. 5 is a sectional view of an outer peripheral portion of a pixel array of the solid-state imaging device according to embodiment 2. In embodiment 2, the description focuses on differences from embodiment 1, and the duplicated description is omitted.

As shown in FIG. 5, solid-state imaging device 200 includes semiconductor substrate 20, first semiconductor layer 11, and second semiconductor layer 12.

Semiconductor substrate 20 is made of a p-type semiconductor. In particular, semiconductor substrate 20 includes: substrate body 20a; and upper portion 20b located outward of second semiconductor layer 12 on substrate body 20a in a plan view. The impurity concentration of substrate body 20a ranges from $1\times10^{16}$ cm$^{-3}$ to $1\times10^{15}$ cm$^{-3}$, for example, and is higher than the impurity concentration of body 10a in semiconductor substrate 10 described in embodiment 1. The impurity concentration of upper portion 20b ranges from $1\times10^{14}$ cm$^{-3}$ to $1\times10^{15}$ cm$^{-3}$, for example, and is approximately the same as the impurity concentration of body 10a in semiconductor substrate 10 described in embodiment 1. The impurity concentration of upper portion 20b is lower than that of substrate body 20a.

In this way, the impurity concentration of substrate body 20a in semiconductor substrate 20 is equal to the impurity concentration of junction portion 10b in semiconductor substrate 10, and substrate body 20a has a high impurity concentration as a whole. Moreover, in substrate body 20a, the concentration gradient is formed to decrease the impurity concentration as the distance to the top surface of substrate body 20a decreases, and substrate body 20a may form a junction with portion 11b in first semiconductor layer 11 in a position in which the impurity concentration is the lowest. With this, the drift speed to APD1 of charges generated in the deep portion (the bottom portion) of semiconductor substrate 20 is accelerated. In such a structure, the impurity concentration of semiconductor substrate 20 is relatively high, and thus the depletion layer is less extended from interface 26 between second semiconductor layer 12 and substrate body 20a toward substrate body 20a. Accordingly, it is difficult to ensure the breakdown voltage using only the depletion layer extending from interface 26 toward substrate body 20a.

Here, with second semiconductor layer 12, it is possible to extend the depletion layer from interface 26 toward second semiconductor layer 12. Accordingly, the effect of improving the breakdown voltage can be obtained.

It should be noted that when the impurity concentration of second semiconductor layer 12 is approximately the same as the impurity concentration of substrate body 20a, the impurities are canceled out and the effective impurity concentration of overlap region 12b in second semiconductor layer 12 (a region surrounded by the dotted line in second semiconductor layer 12) located between first semiconductor layer 11 and substrate body 20a is reduced. Moreover, a part of second semiconductor layer 12 is located outward of first semiconductor layer 11 in a plan view, and the outer lateral surface of first semiconductor layer 11 is covered by second semiconductor layer 12. With this, it is possible to prevent a reduction in the breakdown voltage due to a rounding effect at the corners of the pixel array and a reduction in the breakdown voltage due to misalignment in lithography.

Moreover, the impurity concentration of upper portion 20b is low, and thus a region unintendedly having a high impurity concentration due to manufacturing tolerance is less formed. Accordingly, it is possible to prevent a high electric filed from being generated.

[Advantageous Effects, Etc.]

As described above, in solid-state imaging device 200, semiconductor substrate 20 includes: substrate body 20a; and upper portion 20b located outward of second semiconductor layer 12 on substrate body 20a in a plan view. Solid-state imaging device 200 is one example of a photodetector. The impurity concentration of upper portion 20b is lower than that of substrate body 20a. Substrate body 20a is one example of a third portion, and upper portion 20b is one example of a fourth portion.

As described above, the impurity concentration of upper portion 20b is low, and thus a region unintendedly having a high impurity concentration due to manufacturing tolerance is less formed. Accordingly, it is possible to prevent a high electric filed from being generated.

Embodiment 3

[Structure]

Figure 6:
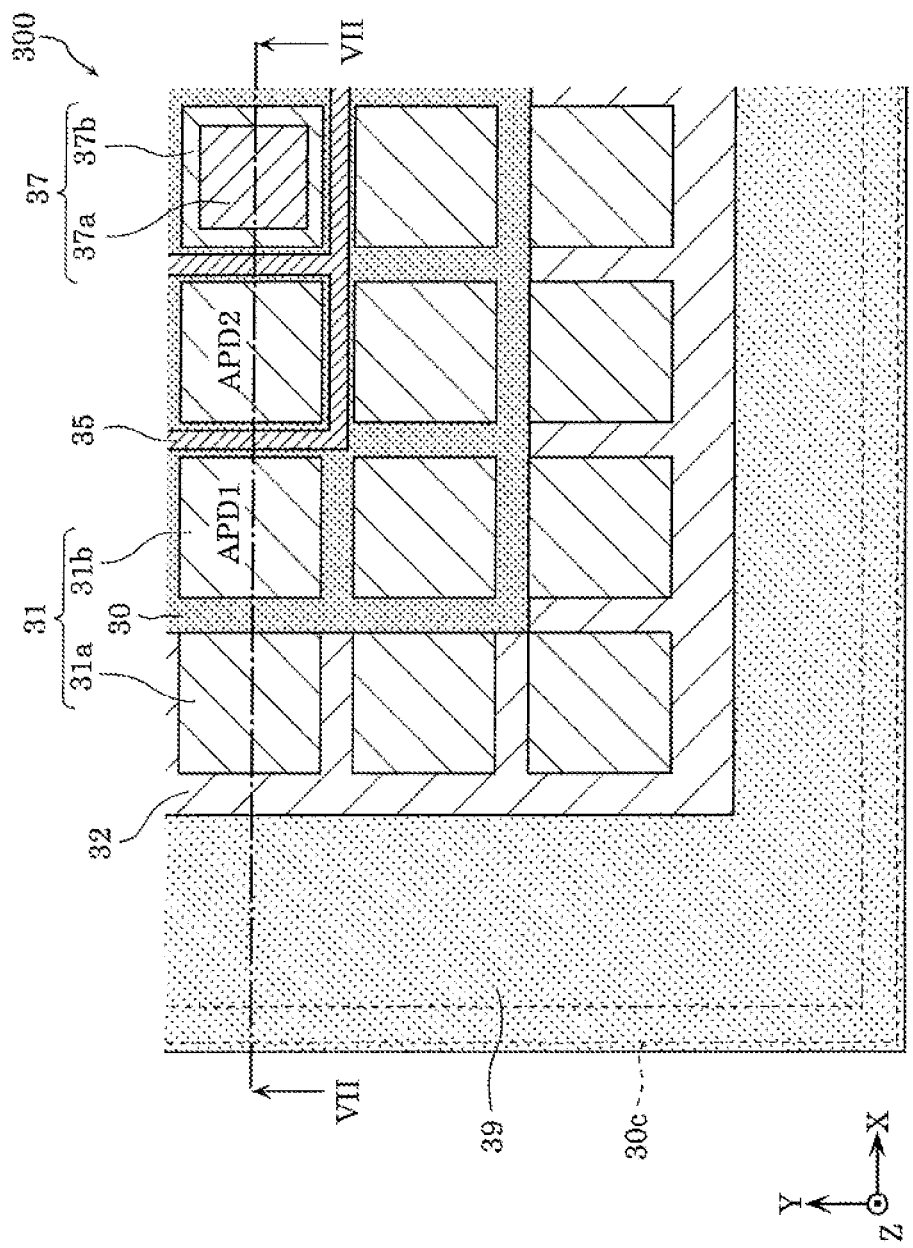
FIG. 6 is a plan view of an outer peripheral portion of a pixel array of a solid-state imaging device according to embodiment 3.
Figure 7:
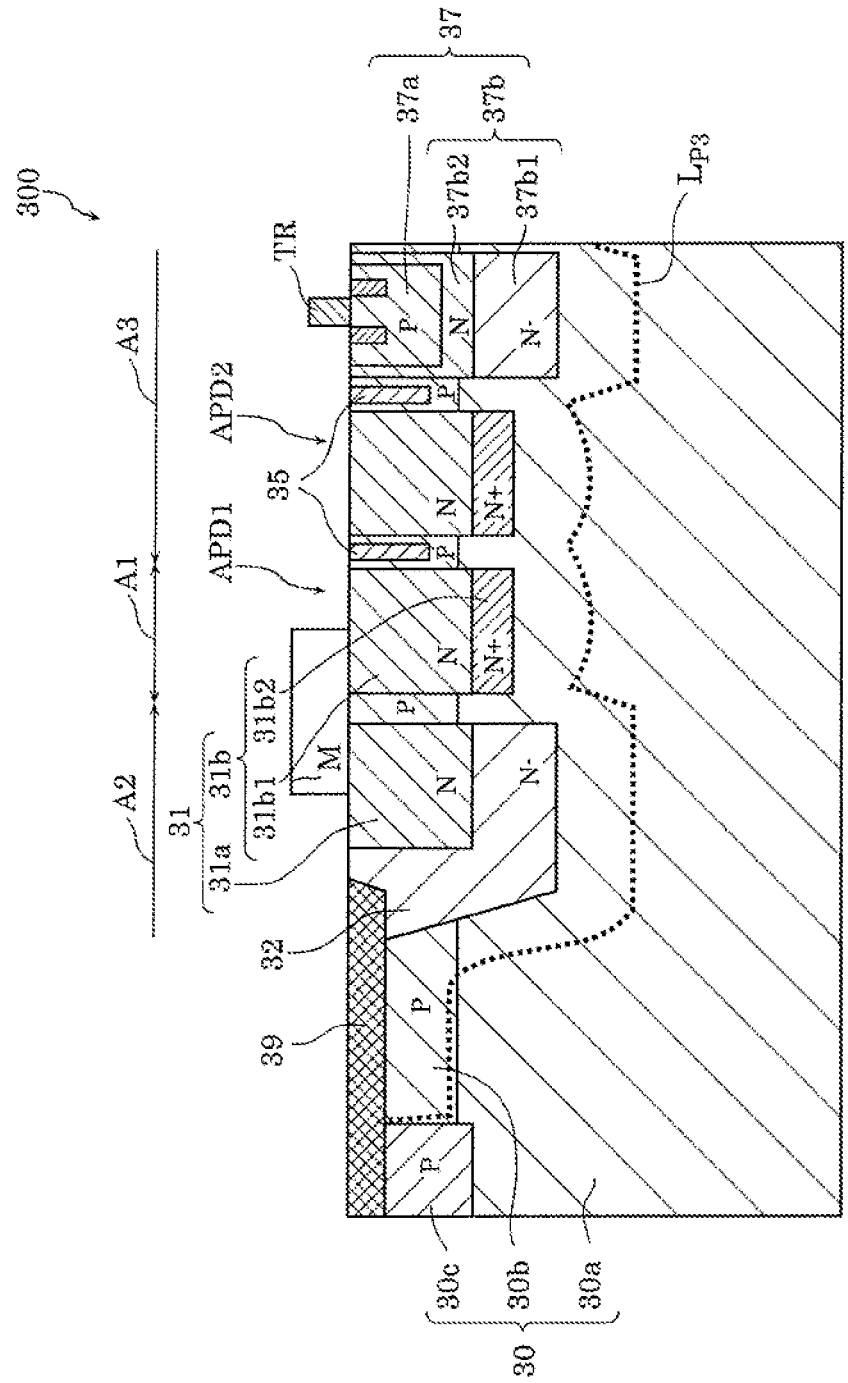
FIG. 7 is a sectional view of the outer peripheral portion of the pixel array of the solid-state imaging device according to embodiment 3.

The following describes the structure of a solid-state imaging device according to embodiment 3. FIG. 6 is a plan view of an outer peripheral portion of a pixel array of the solid-state imaging device according to embodiment 3. FIG. 7 is a sectional view of the outer peripheral portion of the pixel array of the solid-state imaging device according to embodiment 3. FIG. 7 is a sectional view of solid-state imaging device 300 according to embodiment 3 along the line VII-VII in FIG. 6. In embodiment 3, the description focuses on differences from embodiments 1 and 2, and the duplicated description is omitted.

As shown in FIG. 6 and FIG. 7, solid-state imaging device 300 includes semiconductor substrate 30, first semiconductor layer 31, second semiconductor layer 32, isolation region 35, well 37, and shallow trench isolation (STI) 39. It should be noted that first area A1 shown in FIG. 7 is a dummy pixel area, second area A2 outward of first area A1 is an area for reducing the electric field strength, and third area A3 inward of first area A1 is an effective pixel area. In FIG. 7, p-type depletion layer edge $L_{P3}$ is denoted by the dotted line.

Semiconductor substrate 30 is made of a p-type semiconductor material. In particular, semiconductor substrate 30 includes: body 30a; outer peripheral portion 30b located outward of second semiconductor layer 32 on body 30a in a plan view; and outermost peripheral portion 30c located outward of outer peripheral portion 30b on body 30a in a plan view. The impurity concentration of body 30a ranges from $1\times10^{16}$ cm$^{-3}$ to $1\times10^{19}$ cm$^{-3}$, for example, the impurity concentration of outer peripheral portion 30b ranges from $1\times10^{16}$ cm$^{-3}$ to $1\times10^{18}$ cm$^{-3}$, for example, and the impurity concentration of outermost peripheral portion 30c ranges from $5\times10^{16}$ cm$^{-3}$ to $1\times10^{18}$ cm$^{-3}$, for example. The impurity concentration of outer peripheral portion 30b is lower than that of body 30a. The impurity concentration of outermost peripheral portion 30c is higher than that of outer peripheral portion 30b. It should be noted that in body 30a, the concentration gradient is formed to decrease the impurity concentration as the distance to the top surface of body 30a decreases. Moreover, the impurity concentration of a portion of body 30a located directly under first semiconductor layer 31 and in contact with first semiconductor layer 31 ranges from $1\times10^{16}$ cm$^{-3}$ to $1\times10^{18}$ cm$^{-3}$, for example.

In this way, the impurity concentration of outermost peripheral portion 30c is relatively high, and thus it is possible to cause the depletion layer to stop extending in the lateral direction (the X-axis direction in the drawing). With this, it is possible to prevent the leakage current from occurring. It should be noted that outermost peripheral portion 30c is disposed in a region away from the outer edge of second semiconductor layer 32 at approximately the same distance as the width of the depletion layer in the thickness direction of semiconductor substrate 30. The lateral width of outer peripheral portion 30b is greater than the minimum width of the depletion layer in the edge portion of the pixel array.

Moreover, the impurity concentration of outer peripheral portion 30b is low, and thus a region unintendedly having a high impurity concentration due to manufacturing tolerance is less formed. Accordingly, it is possible to prevent a high electric filed from being generated.

First semiconductor layer 31 is made of an n-type semiconductor material. First semiconductor layer 31 is located above semiconductor substrate 30.

Unlike first semiconductor layer 11, first semiconductor layer 31 is separated into pieces. With this, it is possible to stabilize the shape of a resist to be used in injecting the impurities for forming first semiconductor layer 31.

In particular, first semiconductor layer 31 is separated into outer portion 31a located in second area A2 and inner portion 31b located in first area A1. Inner portion 31b includes: body 31b1; and junction portion 31b2 formed under body 31b1 and forming a junction with semiconductor substrate 30.

The impurity concentration of outer portion 31a and the impurity concentration of body 31b1 each range $5\times10^{16}$ cm$^{-3}$ to $1\times10^{19}$ cm$^{-3}$, for example, and the impurity concentration of junction portion 31b2 ranges from $5\times10^{16}$ cm$^{-3}$ to $1\times10^{19}$ cm$^{-3}$, for example. Within such a range of impurity concentration, the impurity concentration of junction portion 31b2 is higher than those of outer portion 31a and body 31b1.

Semiconductor substrate 30 and inner portion 31b form APD1 including a charge multiplication region in which charges are multiplied by avalanche multiplication. APD1 is one example of a photoelectric converter.

When a reverse bias voltage is applied to the bottom surface of semiconductor substrate 30, the charge multiplication region in which a signal charge can be multiplied into multiple signal charges is formed in the vicinity of interface 34 between semiconductor substrate 30 and inner portion 31b. With this charge multiplication region, it is possible to detect weak light of 1 photon. The multiplied signal charges are accumulated in body 31b1.

It should be noted that in the outer peripheral portion of the pixel array, the shape or the like of the APD may be not good. Accordingly, for example, unlike APD2 located closer to the center of the pixel array than APD1 as shown in FIG. 6 and FIG. 7, APD1 formed in the outer peripheral portion of the pixel array is masked and unavailable. In other words, APD1 is a dummy pixel.

The actually used APD2 is surrounded by isolation region 35 in the plan view. Isolation region 35 is made of a p-type semiconductor material. The impurity concentration of isolation area 35 ranges from $1\times10^{15}$ cm$^{-3}$ to $1\times10^{18}$ cm$^{-3}$. In contrast, p-type isolation region 35 for electrically isolating outer portion 31a and inner portion 31b is not provided between outer portion 31a and inner portion 31b. Outer portion 31a and inner portion 31b are electrically connected by wire M (schematically illustrated in FIG. 7), for example.

With this, it is possible to prevent a high electric field from being generated between outer portion 31a and inner portion 31b. When the electric potential of wire M can be set to a given electric potential, it is ensured that outer portion 31a and inner portion 31b have the same electric potential. The electric potential of wire M is fixed to an electric potential lower than the reset electric potential of APD1.

Second semiconductor layer 32 is made of an n-type semiconductor material. Second semiconductor layer 32 is located between semiconductor substrate 30 and outer portion 31a of first semiconductor layer 31, in second area A2 outward of first area A1. The impurity concentration of second semiconductor layer 12 ranges from $1\times10^{10}$ cm$^{-3}$ to $1\times10^{18}$ cm$^{-3}$. As shown in FIG. 7, second semiconductor layer 32 is in contact with outer portion 31a to cover the outer lateral surface of outer portion 31a. Moreover, the outer lateral surface of second semiconductor layer 32 is inclined. The effect obtained by second semiconductor layer 32 is the same as the effect obtained by second semiconductor layer 12.

In well 37, a pixel circuit for reading out signal charges outputted from APD2 is disposed. In particular, on the top surface of well 37, transistor TR for reading out the signal charges outputted from APD2 is disposed. Well 37 is located above semiconductor substrate 30, in third area A3 inward of first area A1. P-type isolation region 35 is located between well 37 and first semiconductor layer 31 in APD2.

In particular, well 37 includes: p-type first well 37a; and n-type second well 37b covering the lateral surface and the bottom surface of first well 37a. Second well 37b includes: junction portion 37b1 in contact with semiconductor substrate 30; and body 37b2 on junction portion 37b1.

Like second semiconductor layer 32, second well 37b (junction portion 37b1 and body 37b2) can cause the depletion layer between second well 37b and semiconductor substrate 30 to be extended. Accordingly, it is possible to prevent punch-through.

Moreover, well 37 extends to a level below first semiconductor layer 31 in the thickness direction of semiconductor substrate 30. With this, it is possible to form junction portion 37b1 and second semiconductor layer 32 simultaneously at the same step in manufacturing solid-state imaging device 300. In other words, the number of steps in manufacturing solid-state imaging device 300 can be reduced. Moreover, an alignment margin can be shrunk, and thus it is possible to reduce the area of the edge portion of the pixel array.

It should be noted that the impurity concentration of first well 37a ranges from $5\times10^{16}$ cm$^{-3}$ to $1\times10^{18}$ cm$^{-3}$, the impurity concentration of junction portion 37b1 ranges from $1\times10^{16}$ cm$^{-3}$ to $1\times10^{18}$ cm$^{-3}$, and the impurity concentration of body 37b2 ranges from $5\times10^{16}$ cm$^{-3}$ to $1\times10^{18}$ cm$^{-3}$. Within such a range of impurity concentration, the impurity concentration of junction portion 37b1 is lower than that of body 37b2.

STI 39 covers a portion outward of first semiconductor layer 31 in the top surface of semiconductor substrate 30. In the plan view, STI 39 is a rectangular ring (i.e. a frame shape). With this STI 39, it is possible to reduce the volume of the depletion layer to prevent the leakage current.

[Variation]

Figure 8:
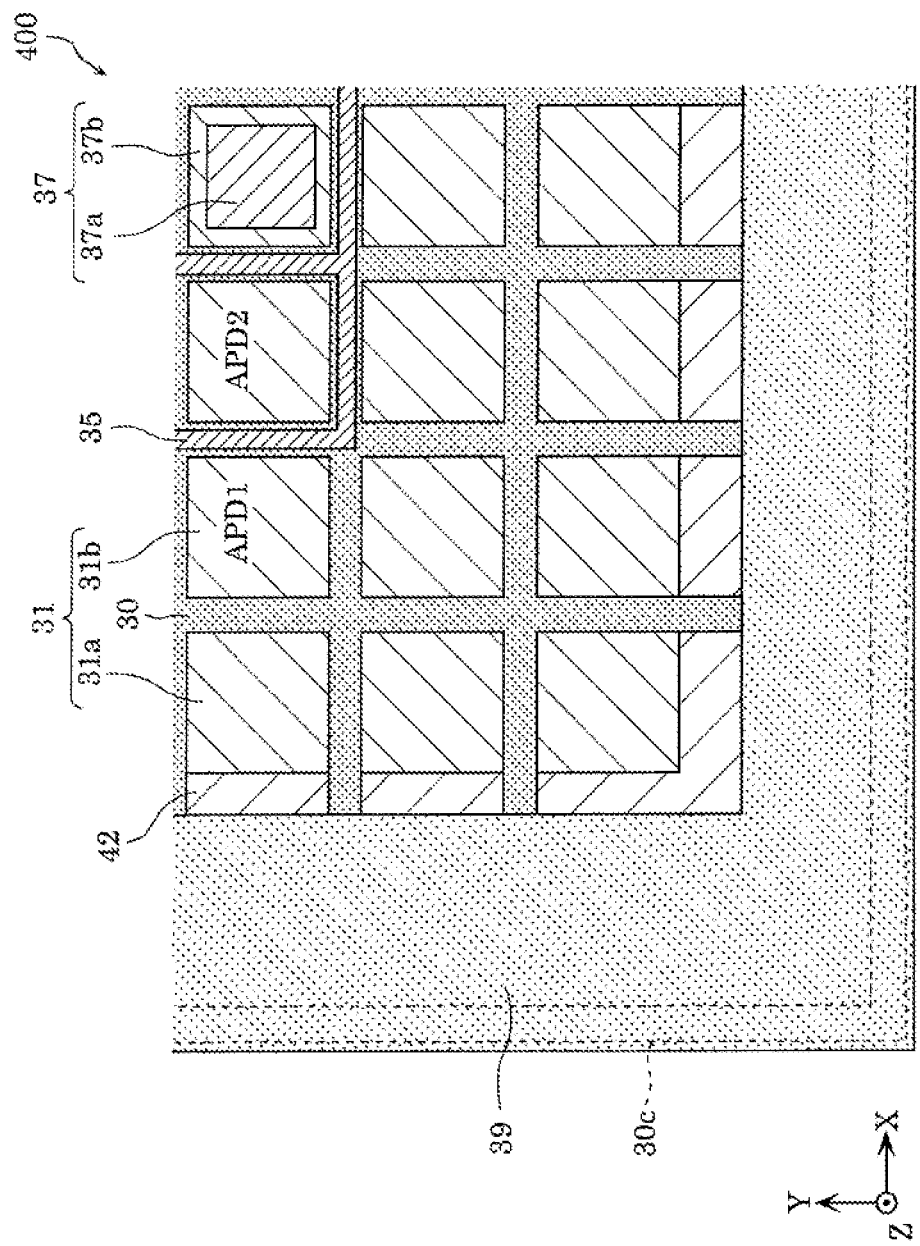
FIG. 8 is a plan view of an outer peripheral portion of a pixel array of a solid-state imaging device according to a variation of embodiment 3.

FIG. 8 is a plan view of an outer peripheral portion of a pixel array of the solid-state imaging device according to embodiment 3. Unlike second semiconductor layer 32, second semiconductor layer 42 included in solid-state imaging device 400 according to a variation of embodiment 3 is separated into pieces. With this, it is possible to stabilize the shape of a resist to be used in injecting the impurity for forming second semiconductor layer 42.

[Advantageous Effects, Etc.]

As described above, solid-state imaging device 300 further includes: well 37 that is located above semiconductor substrate 30, in third area A3 inward of first area A1; and an isolation region of the first conductivity type that is located between well 37 and first semiconductor layer 31. Solid-state imaging device 300 is one example of a photodetector. Well 37 includes: first well 37a of the first conductivity type; and second well 37b of the second conductivity type covering the lateral surface and the bottom surface of first well 37a. For example, the first conductivity type is p-type and the second conductivity type is n-type. Transistor TR is disposed on the top surface of well 37, and well 37 extends to a level below first semiconductor layer 31 in the thickness direction of semiconductor substrate 30.

With this, it is possible to form junction portion 37b1 of well 37 and second semiconductor layer 32 simultaneously at the same step in manufacturing solid-state imaging device 300. In other words, the number of steps in manufacturing solid-state imaging device 300 can be reduced.

In particular, semiconductor substrate 30 further includes outermost peripheral portion 30c located outward of outer peripheral portion 30b on body 30a in a plan view. Body 30a is one example of a third portion, outer peripheral portion 30b is one example of a fourth portion, and outermost peripheral portion 30c is one example of a fifth portion. The impurity concentration of outermost peripheral portion 30c is higher than that of outer peripheral portion 30b.

Such outermost peripheral portion 30c having the relatively high impurity concentration can cause the depletion layer to stop extending in the lateral direction. Accordingly, it is possible to prevent the leakage current from occurring.

Moreover, first semiconductor layer 31 is separated into outer portion 31a located in second area A2 and inner portion 31b located in first area A1. An isolation region of the first conductivity type for electrically isolating outer portion 31a and inner portion 31b is not provided between outer portion 31a and inner portion 31b, and outer portion 31a and inner portion 31b are electrically connected by wire M.

With this, it is possible to prevent a high electric field from being generated between outer portion 31a and inner portion 31b.

Moreover, solid-state imaging device 300 further includes STI 39 that covers a portion outward of first semiconductor layer 31 in the top surface of semiconductor substrate 30.

With this, it is possible to reduce the volume of the depletion layer to prevent the leakage current.

Moreover, in the plan view, STI 39 is a rectangular ring.

With this, it is possible to reduce the volume of the depletion layer to prevent the leakage current.

Other Embodiments

Hereinbefore, the solid-state imaging device according to each of the above embodiments was described, but the present disclosure is not limited to the above embodiments.

For example, in each embodiment, the solid-state imaging device was described, but the present disclosure may be implemented as a photodetector other than the solid-state imaging device (i.e. a photo sensor) that does not capture an image.

For example, all the numbers in each embodiment are specific examples for describing the present disclosure, and the present disclosure is not limited to these numbers.

Moreover, in each of the above embodiments, a main material included in each layer of the layer structure of the solid-state imaging device was illustrated, but each layer of the layer structure of the solid-state imaging device may include another material as long as the same functionality as the layer structure in each embodiment can be achieved. Moreover, in the drawings, the corner and side of each structural component are illustrated linearly, but a corner and side rounded for reasons such as a manufacturing process are also included in the present disclosure.

Forms obtained by various modifications to the foregoing embodiments that can be conceived by a person of skill in the art as well as forms realized by arbitrarily combining structural components and functions in the embodiments which is within the scope of the essence of the present disclosure are included in the present disclosure. For example, the present disclosure may be implemented as a method for manufacturing the solid-state imaging device.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The solid-state imaging device according to the present disclosure can be applied to a solid-state imaging apparatus requiring a large-scale pixel circuit. The solid-state imaging device according to the present disclosure is applicable to a distance image sensor, etc., and thus is useful in industrial fields.

What is claimed is:
1. A photodetector, comprising:
a semiconductor substrate of a first conductivity type;
a first semiconductor layer of a second conductivity type that is located above the semiconductor substrate and forms a junction with the semiconductor substrate in a first area, the second conductivity type being different from the first conductivity type; and
a second semiconductor layer of the second conductivity type that is located above the semiconductor substrate in a second area outward of the first area, the second semiconductor layer having an impurity concentration lower than an impurity concentration of the first semiconductor layer, wherein
the semiconductor substrate includes a first junction portion,
the first semiconductor layer includes a second junction portion having a higher impurity concentration than a remaining portion of the first semiconductor layer, the second junction portion being joined to the first junction portion,
the second semiconductor layer extends to a level below an interface between the first junction portion-and the second junction portion-in a thickness direction of the semiconductor substrate, and
the second semiconductor layer is in contact with both the first junction portion and the second junction portion.
2. The photodetector according to claim 1, wherein
the semiconductor substrate includes: a third portion; and a fourth portion that is located on the third portion and in contact with the first semiconductor layer, and
an impurity concentration of the fourth portion is higher than an impurity concentration of the third portion.
3. The photodetector according to claim 1, wherein
the semiconductor substrate includes: a third portion; and a fourth portion that is located outward of the second semiconductor layer on the third portion in a plan view.
4. The photodetector according to claim 3, wherein
the semiconductor substrate further includes a fifth portion that is located outward of the fourth portion on the third portion in a plan view, and
an impurity concentration of the fifth portion is higher than an impurity concentration of the fourth portion.

5. The photodetector according to claim 1, wherein
the first semiconductor layer is separated into an outer portion located in the second area and an inner portion located in the first area, and
an isolation region of the first conductivity type for electrically isolating the outer portion and the inner portion is not provided between the outer portion and the inner portion.
6. The photodetector according to claim 1, further comprising:
a shallow trench isolation (STI) that covers a portion outward of the first semiconductor layer in a top surface of the semiconductor substrate.
7. The photodetector according to claim 6, wherein
in a plan view, the STI is a rectangular ring.
8. The photodetector according to claim 1, wherein
the photoelectric converter comprises a plurality of photoelectric converters arranged in an array.
9. A photodetector, comprising:
a semiconductor substrate of a first conductivity type;
a first semiconductor layer of a second conductivity type that is located above the semiconductor substrate and forms a junction with the semiconductor substrate in a first area, the second conductivity type being different from the first conductivity type; and
a second semiconductor layer of the second conductivity type that is located above the semiconductor substrate in a second area outward of the first area, the second semiconductor layer having an impurity concentration lower than an impurity concentration of the first semiconductor layer, wherein
the semiconductor substrate and the first semiconductor layer form a photoelectric converter including a charge multiplication region in which charges are multiplied by avalanche multiplication,
the second semiconductor layer extends to a level below an interface between semiconductor substrate and the first semiconductor layer in a thickness direction of the semiconductor substrate, and
further comprising:
a well that is located above the semiconductor substrate, in a third area inward of the first area; and
an isolation region of the first conductivity type that is located between the well and the first semiconductor layer.
10. The photodetector according to claim 9, wherein
the well includes: a first well of the first conductivity type; and a second well of the second conductivity type that covers a lateral surface and a bottom surface of the first well, and
a transistor is disposed on a top surface of the well.
11. The photodetector according to claim 9, wherein
the well extends to a level below the first semiconductor layer in the thickness direction of the semiconductor substrate.
12. A photodetector, comprising:
a semiconductor substrate of a first conductivity type;
a first semiconductor layer of a second conductivity type that is located above the semiconductor substrate and forms a junction with the semiconductor substrate in a first area, the second conductivity type being different from the first conductivity type; and
a second semiconductor layer of the second conductivity type that is located above the semiconductor substrate in a second area outward of the first area, the second semiconductor layer having an impurity concentration lower than an impurity concentration of the first semiconductor layer, wherein the semiconductor substrate and the first semiconductor layer form a photoelectric converter including a charge multiplication region in which charges are multiplied by avalanche multiplication, the second semiconductor layer extends to a level below an interface between semiconductor substrate and the first semiconductor layer in a thickness direction of the semiconductor substrate, the first semiconductor layer is separated into an outer portion located in the second area and an inner portion located in the first area, an isolation region of the first conductivity type for electrically isolating the outer portion and the inner portion is not provided between the outer portion and the inner portion, and wherein the outer portion and the inner portion are electrically connected by a wire.

13. A photodetector, comprising:

a semiconductor substrate of a first conductivity type;

a first semiconductor layer of a second conductivity type that is located above the semiconductor substrate and forms a junction with the semiconductor substrate in a first area, the second conductivity type being different from the first conductivity type;

a second semiconductor layer of the second conductivity type that is located above the semiconductor substrate in a second area outward of the first area and has an impurity concentration lower than an impurity concentration of the first semiconductor layer;

a photoelectric converter that is located in a third area inward of the first area and includes a charge multiplication region in which charges are multiplied by avalanche multiplication; and an isolation region of the first conductivity type that is located between the first area and the third area.

14. The photodetector according to claim 13, wherein in a plan view, the photoelectric converter is surrounded by the isolation region.

* * * * *